United States Patent
Liu et al.

(10) Patent No.: US 9,420,734 B2
(45) Date of Patent: Aug. 16, 2016

(54) COMBINED ELECTROMAGNETIC SHIELD AND THERMAL MANAGEMENT DEVICE

(71) Applicants: Baomin Liu, Austin, TX (US); Todd W. Steigerwald, Austin, TX (US)

(72) Inventors: Baomin Liu, Austin, TX (US); Todd W. Steigerwald, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 219 days.

(21) Appl. No.: 14/231,988

(22) Filed: Apr. 1, 2014

(65) Prior Publication Data

US 2015/0282392 A1   Oct. 1, 2015

(51) Int. Cl.
| | |
|---|---|
| H05K 9/00 | (2006.01) |
| H05K 7/20 | (2006.01) |
| H05K 1/02 | (2006.01) |
| H01L 23/36 | (2006.01) |
| H01L 23/552 | (2006.01) |

(52) U.S. Cl.
CPC .............. *H05K 9/0024* (2013.01); *H01L 23/36* (2013.01); *H01L 23/552* (2013.01); *H05K 9/0026* (2013.01); *H01L 2924/0002* (2013.01); *H05K 1/0209* (2013.01); *H05K 1/0243* (2013.01); *H05K 2201/10371* (2013.01); *Y10T 29/4902* (2015.01)

(58) Field of Classification Search
CPC combination set(s) only.
See application file for complete search history.

(56) References Cited

U.S. PATENT DOCUMENTS

| | | | |
|---|---|---|---|
| 4,371,742 A | 2/1983 | Manly | |
| 4,647,714 A * | 3/1987 | Goto | H05K 9/0003 174/36 |
| 4,889,750 A | 12/1989 | Wiley | |
| 4,948,922 A | 8/1990 | Varadan et al. | |
| 5,294,826 A * | 3/1994 | Marcantonio | H01L 23/315 257/659 |
| 5,500,789 A | 3/1996 | Miller et al. | |
| 5,583,318 A | 12/1996 | Powell | |
| 5,912,809 A | 6/1999 | Steigerwald et al. | |
| 6,011,690 A * | 1/2000 | Hughes | H05K 5/0269 174/535 |

(Continued)

FOREIGN PATENT DOCUMENTS

JP   60186043 A  *  9/1985

OTHER PUBLICATIONS

Interference Technology; *Air-Inflated EMI/RFI Shelters Offer Fast Set-Up and Take-Down*; www.interferencetechnology.com/air-inflated-emirfi-shelters-offer-fast-set-take/; Apr. 8, 2014; pp. 1-2.

(Continued)

*Primary Examiner* — Robert J Hoffberg
(74) *Attorney, Agent, or Firm* — Timothy M. Honeycutt

(57) ABSTRACT

Various EMI shields with thermal management capabilities are disclosed. In one aspect, an EMI shield is provided that includes a thermal spreader plate adapted to be seated on and convey heat from an electromagnetic emissions generating component. The thermal spreader plate has a first material composition and a shield effectiveness that is absorption dominant to electromagnetic waves at a given electromagnetic emissions frequency. The EMI shield also includes a shell to cover and reflect electromagnetic emissions from the electromagnetic emissions generating component. The shell has a second material composition different than the first material composition and a shield effectiveness that is reflection dominant to electromagnetic waves at the given electromagnetic emissions frequency.

18 Claims, 8 Drawing Sheets

(56) References Cited

U.S. PATENT DOCUMENTS

| | | | |
|---|---|---|---|
| 6,122,167 A | 9/2000 | Smith et al. | |
| 6,150,895 A | 11/2000 | Steigerwald et al. | |
| 6,337,798 B1 | 1/2002 | Hailey et al. | |
| 6,504,242 B1* | 1/2003 | Deppisch | H01L 23/3736 257/706 |
| 6,542,380 B1 | 4/2003 | Hailey et al. | |
| 6,570,086 B1* | 5/2003 | Shimoji | H05K 9/0024 174/377 |
| 6,753,093 B2* | 6/2004 | Tanaka | B22D 19/14 257/E23.106 |
| 6,856,506 B2 | 2/2005 | Doherty et al. | |
| 6,914,197 B2 | 7/2005 | Doherty et al. | |
| 7,164,933 B1 | 1/2007 | Steigerwald et al. | |
| 7,262,369 B1 | 8/2007 | English | |
| 7,362,580 B2* | 4/2008 | Hua | H01L 23/10 257/E23.09 |
| 7,369,879 B1 | 5/2008 | Steigerwald et al. | |
| 7,623,360 B2 | 11/2009 | English et al. | |
| 7,725,132 B1 | 5/2010 | Steigerwald et al. | |
| 7,969,730 B1 | 6/2011 | Doherty et al. | |
| 8,077,032 B1 | 12/2011 | Vier et al. | |
| 8,085,060 B2 | 12/2011 | Steigerwald et al. | |
| 8,104,165 B1 | 1/2012 | Steigerwald et al. | |
| 8,138,978 B1 | 3/2012 | Vier et al. | |
| 8,198,903 B2 | 6/2012 | Hailey et al. | |
| 8,207,598 B2 | 6/2012 | Ararao et al. | |
| 8,347,486 B1 | 1/2013 | Steigerwald et al. | |
| 8,374,660 B1 | 2/2013 | Steigerwald et al. | |
| 8,723,308 B2* | 5/2014 | Yang | B81B 7/0064 174/50.5 |
| 8,766,429 B2* | 7/2014 | Kim | H01L 25/105 257/659 |
| 9,137,928 B2* | 9/2015 | Chen | H05K 7/2039 |
| 9,142,470 B2* | 9/2015 | Yang | B81B 7/0064 |
| 9,224,672 B1* | 12/2015 | Pykari | H01L 23/373 |
| 2003/0161132 A1* | 8/2003 | Shimoji | H01L 23/433 361/800 |
| 2003/0235029 A1 | 12/2003 | Doherty et al. | |
| 2004/0188133 A1 | 9/2004 | Doherty et al. | |
| 2005/0205292 A1 | 9/2005 | Rogers et al. | |
| 2005/0213298 A1 | 9/2005 | Doherty et al. | |
| 2006/0221565 A1 | 10/2006 | Doherty et al. | |
| 2008/0153210 A1* | 6/2008 | Hua | H01L 23/10 438/122 |
| 2009/0163147 A1 | 6/2009 | Steigerwald et al. | |
| 2010/0207641 A1 | 8/2010 | Hailey et al. | |
| 2011/0169503 A1 | 7/2011 | Hailey et al. | |
| 2012/0068730 A1 | 3/2012 | Hailey et al. | |
| 2012/0118627 A1* | 5/2012 | Chang | H05K 9/0045 174/388 |
| 2015/0043162 A1* | 2/2015 | Chen | H01L 23/3675 361/679.55 |
| 2015/0140736 A1* | 5/2015 | Pendse | H01L 24/19 438/109 |
| 2015/0259194 A1* | 9/2015 | Lin | B81B 7/007 257/773 |

OTHER PUBLICATIONS

The Clemson University Vehicular Electronics Laboratory; *Near Field Shielding Effectiveness Calculator*; www.cvel.clemson.edu/emc/calculators/SE_Calculator/nearfieldSE; May 27, 2014; pp. 1-2.

Mississippi State; *Shielding*; www.ece.msstate.edu/~donohoe/ece4323shielding; Apr. 10, 2012; pp. 1-15.

Laird Technologies; *Shielding Effectiveness Calculator*; www.lairdtech.com/ad/index; 2011; pp. 1-2.

Interference Technology; *RF Shielding Tent Attains −98.9 dB in 800-2,400 MHz Cellular Band*; www.interferencetechnology.com/rf-shielding-tent-attains-98-9-db-800-2400-mhz-cellular-band/; Jan. 1, 2014; pp. 1-2.

Rutgers University; *Reflection and Transmission*; Chapter 5; Aug. 31, 2010; pp. 184.

Chatterton, P.A. and Holden, M.A.; *EMC: Electro Magnetic Theory*; 1992; pp. 136-147.

Kaiser, Kenneth L.; *Electromagnetic Shielding; Additional Shielding Concepts*; Chapters 4.2, 4.3 and 4.4; 2006; pp. 4-3 thru 4-17.

Paul, Clayton R.; *Introduction to Electromagnetic Compatability Paul Wiley*; 2006; pp. 718-743.

Ott, H.W.; *Noise Reduction Techniques in Electronic Systems*; 1976; pp. 178-181.

Lustre-Cal Corp.; *Multiple Layer EMI Shielding*; Lustre-Cal Technical White Paper; Jan. 2002, 1 page.

* cited by examiner

COMBINED ELECTROMAGNETIC SHIELD AND THERMAL MANAGEMENT DEVICE

BACKGROUND OF THE INVENTION

1. Field of the Invention

This invention relates generally to electronic devices, and more particularly to thermal management and electromagnetic interference shielding for electronic devices.

2. Description of the Related Art

The form factors and thicknesses of handheld computing devices, such as smart phones, tablet computers and e-book readers, have been trending downward for some time. At the same time, the complexity and power dissipation of these devices has been increasing. There is ongoing user demand for devices that are not only smaller form factor for greater portability but also powerful enough to handle video and other computing intensive tasks. The provision for significant computing power in a relatively small form device often translates into the need for significant thermal management of the heat dissipating devices. The inclusion of electromagnetic interference (EMI) sensitive components, such as radios, into these devices has introduced challenges in EMI shielding in addition to thermal management. Onboard components, such as processors, generate electromagnetic emissions with electric field (E-field) and magnetic field (H-field components) that interfere with the operations of the onboard radios. The near field effects created by the tight spacing in small form electronic devices present shielding challenges.

One common solution used to transfer heat from a processor in a small form device includes the use of a thermal spreader that is in thermal contact with the processor. The heat spreader is in turn, in thermal contact with a heat exchanger via a heat pipe or other structure. The heat exchanger often includes an air mover such as a fan. One example of such a conventional device is the model LE1700 manufactured by Motion Computing, Inc. The LE1700 includes a very thin fan that drives air flow through metal fins that are connected thermally to a thermal spreader mounted to the microprocessor and by way of a heat pipe. The hot air then goes to the external ambient by way of a small vent. An Acer model Iconia is another conventional example.

In many conventional designs, EMI shielding and thermal management have been treated as discrete problems and addressed with discrete solutions. One conventional EMI shield design utilizes a shell that is placed over a processor on a system board. The shell is connected to the system board ground plane, but is not in thermal contact with the processor and thus does not provide thermal management.

The present invention is directed to overcoming or reducing the effects of one or more of the foregoing disadvantages.

SUMMARY OF THE INVENTION

In accordance with one aspect of the present invention, an EMI shield is provided that includes a thermal spreader plate adapted to be seated on and convey heat from an electromagnetic emissions generating component. The thermal spreader plate has a first material composition and a shield effectiveness that is absorption dominant to electromagnetic waves at a given electromagnetic emissions frequency. The EMI shield also includes a shell to cover and reflect electromagnetic emissions from the electromagnetic emissions generating component. The shell has a second material composition different than the first material composition and a shield effectiveness that is reflection dominant to electromagnetic waves at the given electromagnetic emissions frequency.

In accordance with another aspect of the present invention, an apparatus is provided that includes a substrate, an electromagnetic emissions generating component on the substrate and an electromagnetic emissions shield coupled to the substrate. The shield has a thermal spreader plate seated on the electromagnetic emissions generating component. The thermal spreader plate has a first material composition and a shield effectiveness that is absorption dominant to electromagnetic waves at a given electromagnetic emissions frequency. The shield also includes a shell to cover and reflect electromagnetic emissions from the electromagnetic emissions generating component. The shell has a second material composition different than the first material composition and a shield effectiveness that is reflection dominant to electromagnetic waves at the given electromagnetic emissions frequency.

In accordance with another aspect of the present invention, a method of thermally managing and electromagnetically shielding an electromagnetic emissions generating component is provided. The method includes seating a thermal spreader plate on the electromagnetic emissions generating component. The thermal spreader plate has a first material composition and a shield effectiveness that is absorption dominant to electromagnetic waves at a given electromagnetic emissions frequency. The method also includes covering the thermal spreader plate and the electromagnetic emissions generating component with a shell to reflect electromagnetic emissions from the electromagnetic emissions generating component. The shell has a second material composition different than the first material composition and a shield effectiveness that is reflection dominant to electromagnetic waves at the given electromagnetic emissions frequency.

In accordance with another aspect of the present invention, a method of manufacturing is provided that includes fabricating a thermal spreader plate adapted to be seated on and convey heat from an electromagnetic emissions generating component where the thermal spreader plate has a first material composition and a shield effectiveness that is absorption dominant to electromagnetic waves at a given electromagnetic emissions frequency. A shell is fabricated to cover and reflect electromagnetic emissions from the electromagnetic emissions generating component. The shell has a second material composition different than the first material composition and a shield effectiveness that is reflection dominant to electromagnetic waves at the given electromagnetic emissions frequency.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a computing device are disclosed. In one arrangement, a computing device, such as a tablet computer, includes a housing with an internal space holding a circuit board and an electromagnetic emissions generating component, such as a semiconductor chip. A combined EMI shield and thermal spreader is mounted over the electromagnetic emissions generating component. The shield and thermal spreader includes a spreader plate on the chip and a shell over the spreader plate and chip. The spreader plate is fabricated with a material composition that is absorption dominant to electromagnetic waves to electromagnetic waves and the shell is fabricated with a different material composition that is reflection dominant to electromagnetic waves to electromagnetic waves. This arrangement produces an electromagnetic intrinsic wave impedance mismatch between the spreader plate and the shell, which enhances signal attenuation due to multiple wave reflections at layer interfaces. Additional details will now be described.

Figure 1:
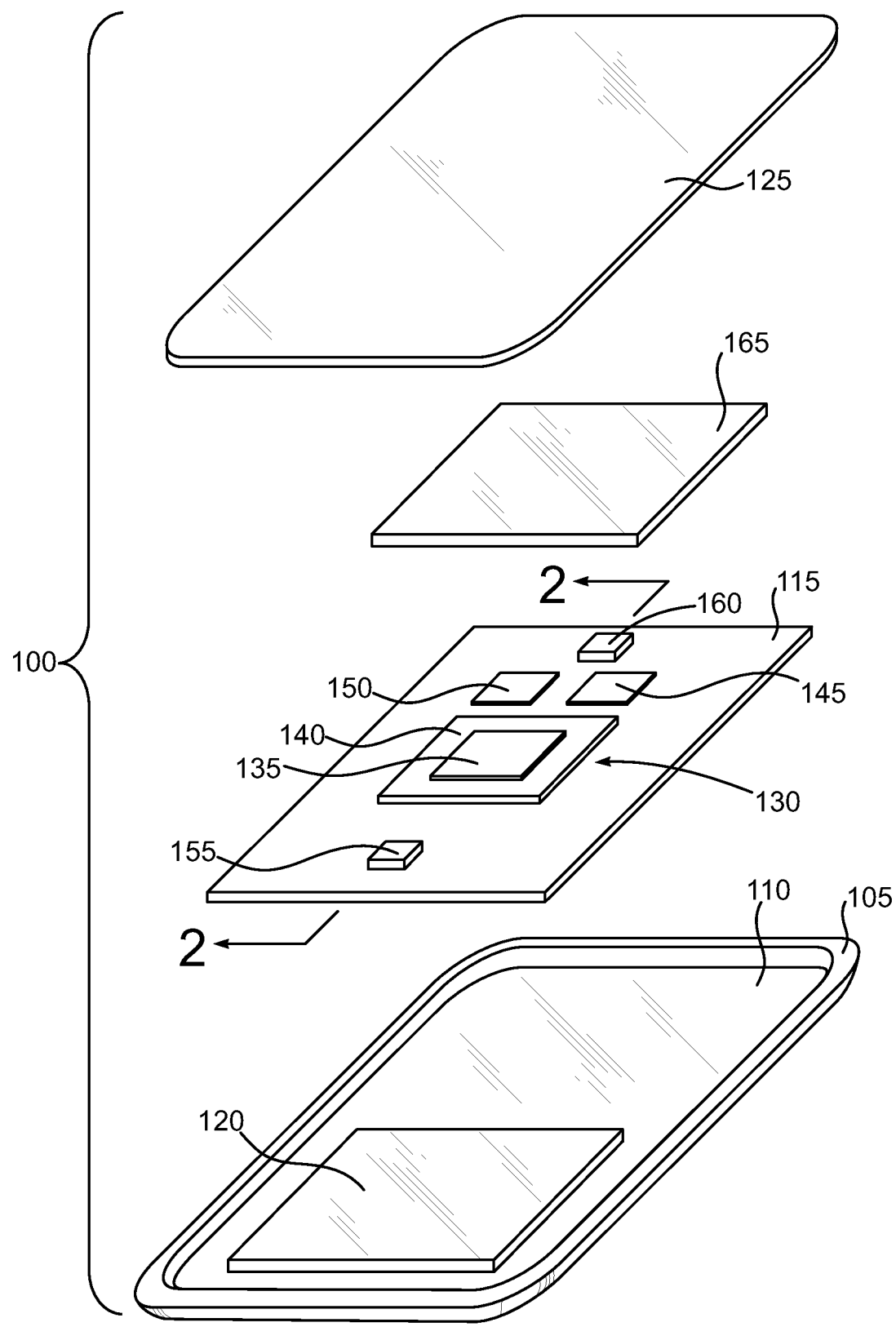
FIG. 1 is an exploded pictorial view of an exemplary embodiment of a computing device with an EMI shield.

In the drawings described below, reference numerals are generally repeated where identical elements appear in more than one figure. Turning now to the drawings, and in particular to FIG. 1 which is an exploded pictorial view of an exemplary embodiment of a computing device 100 that includes a housing 105 that includes an internal volume 110 designed to hold a variety of components, such as a substrate 115 configured as a circuit board or other type of substrate and a battery 120. A display unit 125, which may or may not be touch-enabled, may be seated on the housing 105. The housing 105 may be composed of well-known materials such as plastics, carbon fibers, aluminum, stainless steel or others. The computing device 100 may be any of a number of different types of computing devices, such as hand held computers, smart phones, or virtually any other portable computing device.

The substrate 115 may be populated by a variety of components, a few of which are depicted in FIG. 1. For example, the substrate 115 may include one or more electromagnetic emissions generating components, such as a packaged semiconductor device 130 that includes a semiconductor chip 135 mounted on a package substrate 140, as well as other devices such as the memory devices 145 and 150. In addition, the substrate 115 may include one or more radios 155 and 160. The radios 155 and 160 may be near field communications devices, local area network devices, wide area network devices, global positioning devices, radio frequency identification devices, combinations of these or other types of communications devices. To shield the radios 155 and 160 from potentially interfering electromagnetic (E-field and H-field) emissions from the semiconductor chip 135 and/or the chips 145 and 150, an EMI shield/thermal spreader 165 (hereinafter STS 165) may be placed over the semiconductor chip device 130 and the chips 145 and 150 as well as any other components that might produce potentially interfering emissions. The STS 165 is designed to provide both thermal management and electromagnetic emission shielding. In this illustrative embodiment, the STS 165 and the substrate 115 may have rectangular footprints. However, various other types of footprints are possible as will be illustrated in subsequent figures. It should be understood that the STS 165 and any disclosed alternatives may be used to provide thermal management and E-field/H-field shielding in virtually any circumstance where a given device may be sensitive to E-field/H-field interference from another nearly located device that is emitting such potentially interfering emissions. Examples of such devices are legion and include microprocessors, graphics processors, optical chips, systems-on-chip, combined microprocessors/graphics processors or virtually any other type of integrated circuit.

Figure 2:
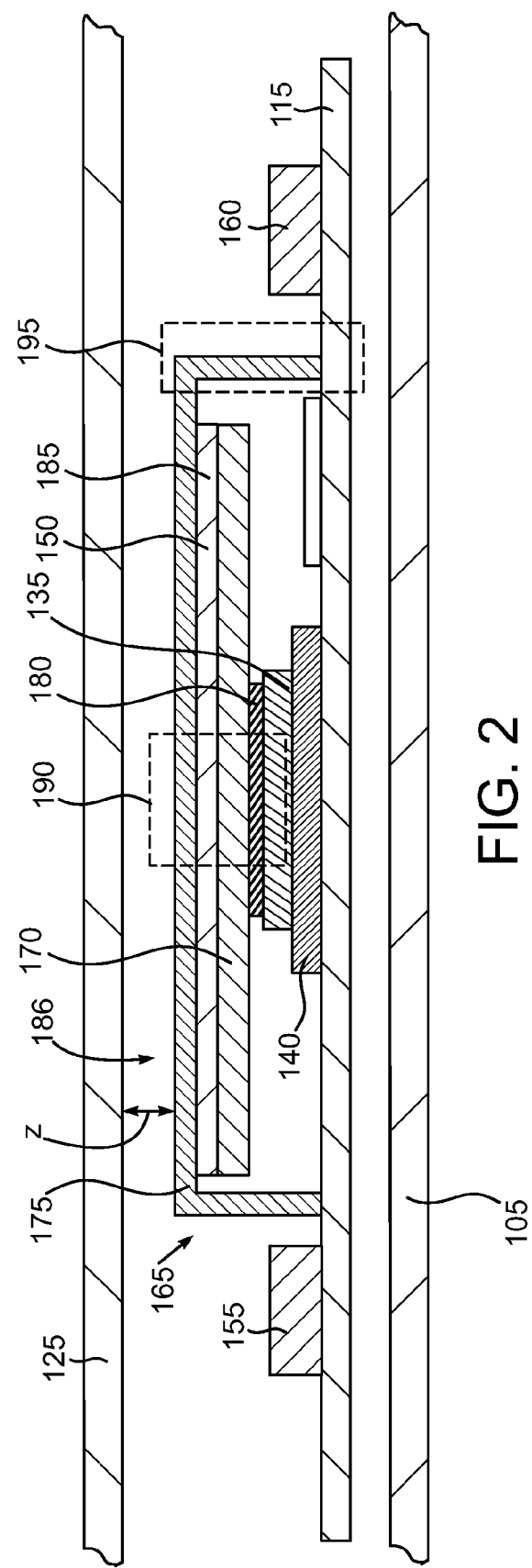
FIG. 2 is a sectional view of FIG. 1 taken at section 2-2.

Additional details of the substrate 115 and the STS 165 may be understood by referring now also to FIG. 2, which is a sectional view of a portion of FIG. 1 taken at section 2-2. It should be understood that FIG. 2 shows the substrate 115 and the STS 165 but only portions of the housing 105 and the display unit 125 depicted in FIG. 1 are shown for simplicity of illustration. The mounting substrate 140 may be electrically interfaced with the substrate 115 in a variety of ways. For example, ball grid arrays, pin grid arrays or other types of interconnect schemes may be used. As noted above, two functions of the STS 165 are to providing thermal management for components, such as the semiconductor chip 135, and to shield the radios 155 and 160 from potentially interfering E-field and H-field emissions from the semiconductor chip 135 and/or the semiconductor chips 145 and 150 (only 150 is visible in the sectional view of FIG. 2). In this regard, the STS 165 may include a thermal spreader plate 170 and an external shell 175. The thermal spreader plate 170 is designed to provide thermal management for the semiconductor chip 135. A thermal interface material 180 may be positioned between the spreader plate 170 and the semiconductor chip 135. Another thermal interface material 185 may be positioned between the spreader plate 170 and the shell 175. Thermal interface materials 180 and 185 may play a part in attenuating E-field and H-field emissions as described below. Accordingly, exemplary materials for the thermal interface materials 180 and 185 will also be described in more detail below. The types of materials suitable for the shell 175 and the spreader plate 170 will influence the shielding and thermal management characteristics of the STS 165 and will be discussed in more detail below.

The shield shell 175 also plays a part in thermal management in a few ways. The shell 175 reduces the width z of the gap 186 between the display 125 and the STS 165 below what a typical conventional EMI shield in a portable device would yield. A typical value of z for a conventional design might be around 1.0 mm. In an exemplary embodiment the value of z may be much less than 1.0 mm. A smaller value of z translates into less thermal resistance of the fluid (e.g., air) in the gap 186. In addition, the shell 175 provides a relatively larger surface area and thus improved thermal spreading functionality. Finally, the shell 175 provides a conductive heat transfer pathway from the chip 135 to the substrate 115.

Figure 3:
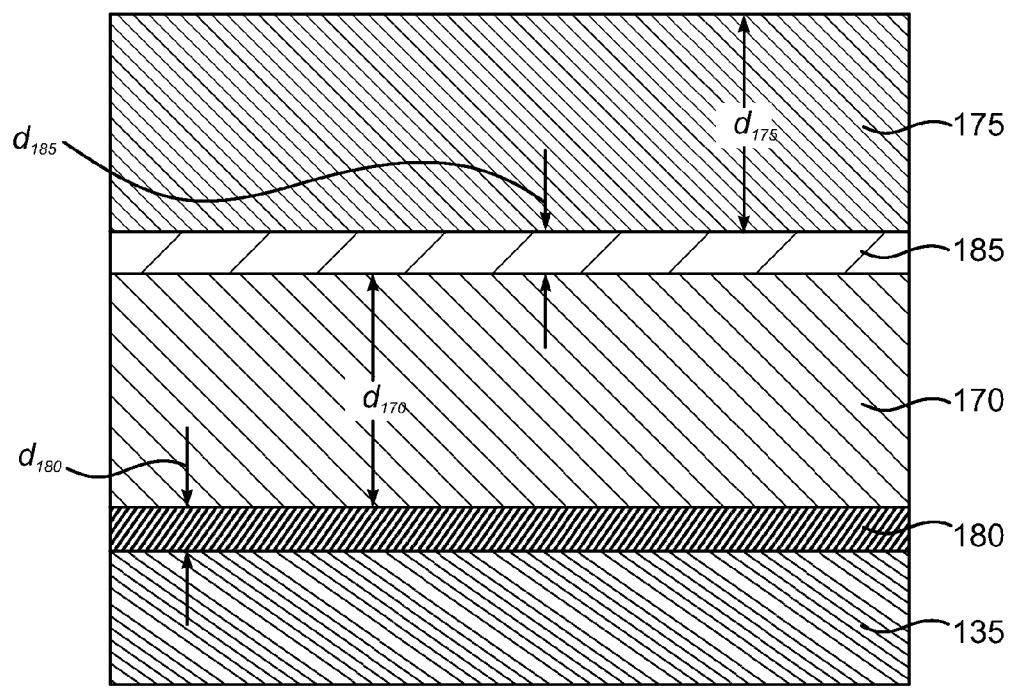
FIG. 3 is a portion of FIG. 2 shown at greater magnification.

The portion of FIG. 2 circumscribed by the dashed rectangle 190 will be shown at greater magnification in FIG. 3 and used to illustrate additional features of the STS 165. The portion of FIG. 2 circumscribed by the dashed rectangle 195 will be shown at greater magnification in the subsequent figure to illustrate an exemplary technique of securing the shield shell 175 to the substrate 115. Attention is now turned to FIG. 3, which as just noted, is the portion of FIG. 2 circumscribed by the dashed rectangle 190. Because of the location of the dashed rectangle 190, portions of the semiconductor chip 135, the thermal interface material 180, the spreader plate 170, the thermal interface material 185, and the shell 175 are visible. The thermal interface material 180 may have some thickness $d_{180}$, the spreader plate 170 may have some thickness $d_{170}$, the thermal interface material 185 may have some thickness $d_{185}$, and the shell 175 may have some thickness $d_{175}$ where $d_{170}$ and $d_{175}$ are selected based on the anticipated E-field and H-field emissions from the semiconductor chip 135 and any other adjacent devices, the anticipated sensitivity to near field interference of other devices on the substrate 115 shown in FIG. 2, as well as a variety of other physical parameters such as material composition, thermal conductivity, electrical conductivity, permeability and the strength of the E-field and H-field emissions from the chip 135. The desired thicknesses of the thermal interface material layers 180 and 185 will be dictated largely, though not exclusively, by thermal management considerations.

Figure 4:
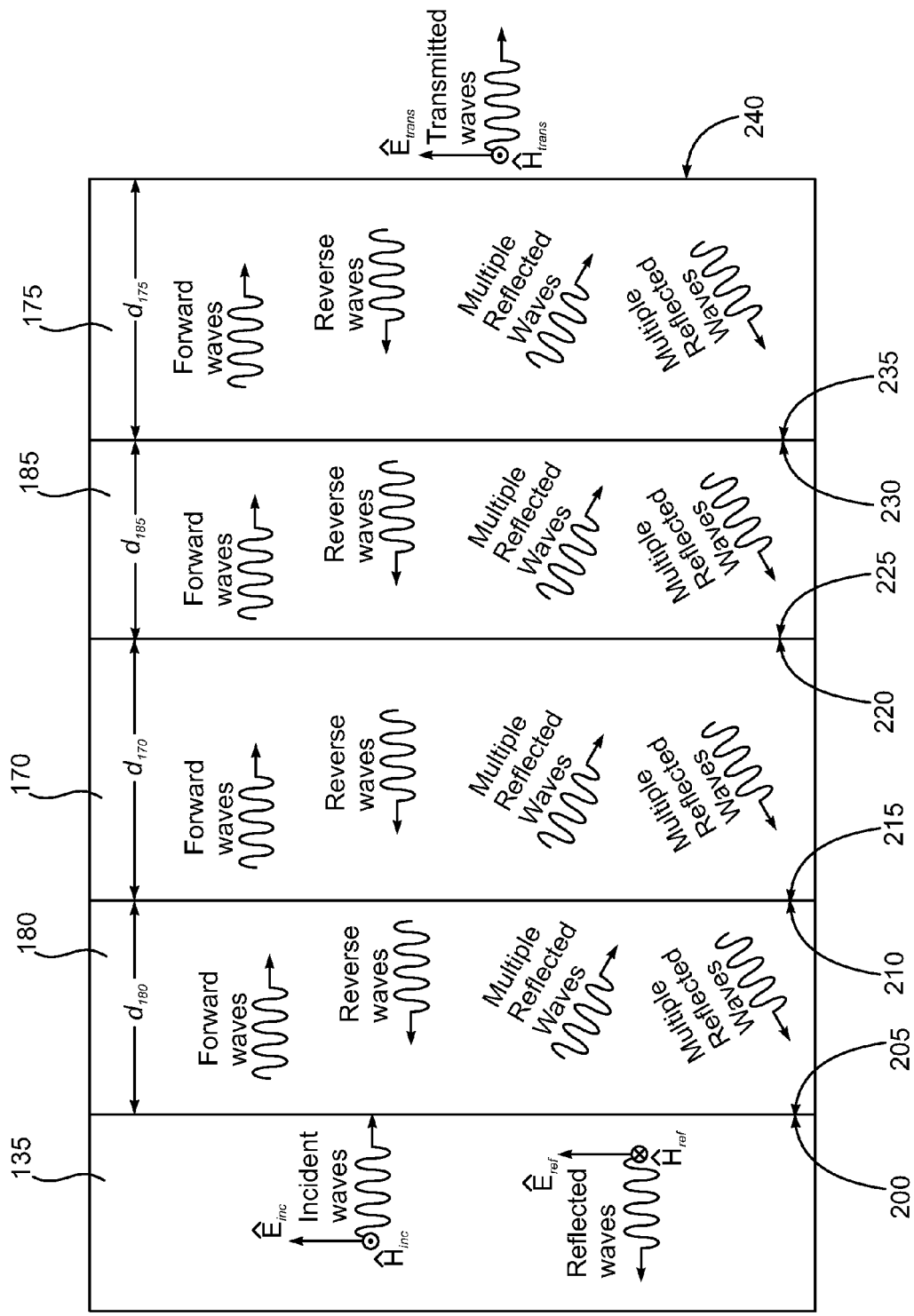
FIG. 4 is a schematic view of a small portion of the computing device depicted in FIGS. 1, 2 and 3 depicting electromagnetic wave propagation.

As noted above, the selection of the materials for the spreader plate 170 and the shield shell 175 as well as the respective thicknesses thereof may be selected in concert to provide a synergistic shielding effect due to a deliberately selected intrinsic wave impedance mismatch between the spreader plate 170 and the shield shell 175. To illustrate the various physical phenomena associated with E-field and H-field propagation from the semiconductor chip 135, attention will be directed to FIG. 4, which is a view like FIG. 3 but with the cross-hatching removed so that various vectors and labels may be more easily seen. Incident waves of electromagnetic energy are generated by the chip 135. The incident waves have an electric field component $\hat{E}_{inc}$ and a magnetic field component $\hat{H}_{inc}$, where the subscript "inc" denotes incident. The traditional technique of using the symbol ⊙ to graphically representing a magnetic field component of an electromagnetic wave coming out of the page and the symbol ⊗ to represent the magnetic field component going into the page is followed here. Some of the incident waves reflect off of the interface 200 between the chip and the thermal interface material 180 and those result in reflected waves which similarly have E-field and H-field components. For simplicity of illustration, the remainder of the various types of waves that propagate through the layers 180, 170, 185 and 175 are shown without E-field and H-field terminology or symbols. Some of the incident waves pass through the interface 200 and into the thermal interface material 180, resulting in plural forward waves, plural reverse waves and plural multiple reflective waves. As described in more detail below, some of the forward waves will produce multiple reflective waves upon encountering the interfaces 210 and 205 on either side of the thermal interface material 180, while others will produce reflected waves. Some of the energy propagating through the layer 180 will be absorbed and some propagated into the spreader plate 170 as forward waves where again reverse waves will exist as well as multiple reflective waves. This process continues through the thermal interface material 185 and the external shell 175 where some portion of the incident waves generated by the chip 135 will emerge from the shield shell 175 as transmitted (sometimes alternatively termed "retransmitted") waves that have both an E-field and H-field component. The total attenuation of the signal from the chip 135 due to the combined mechanisms of reflection, absorption and multiple reflection through the various layers 180, 170, 185 and 175 is such that the magnitude or strength of transmitted waves is less than the magnitude or strength incident waves. The presence of the various interfaces 200, 205, 210, 215, 220, 225, 230, 235 and 240 provide structure to facilitate the attenuation by way of reflection and multiple reflection as described in more detail below. It should be understood that the attenuation due to absorption, reflection and multiple reflection will be dependent on, among other things, the thicknesses $d_{180}$, $d_{170}$, $d_{185}$ and $d_{175}$ of the various layers 180, 170, 185 and 175.

The shield effectiveness SE(f) as a function of frequency f for a hypothetical single layer shield with an air to metal interface is usually denoted in units of dB and given by:

$$SE(f) = R(f) + A(f) + M(f) \quad (1)$$

where R(f) is the signal attenuation due to reflection at air-metal interface, A(f) is the signal attenuation due to absorption in the metal layer and M(f) is signal attenuation due to multiple reflections in the metal layer. Depending on the properties of the shield layer, one component of the right hand side of Equation (1) may be dominant or larger than the others. For the example of a copper layer, the A(f) component will be dominant, while for a stainless layer, the R(f) will be dominant.

The situation is more complex with additional layers of metals and/or dielectrics, including air. The shield effectiveness $SE_{nlayers}(f)$ as a function of f for a shield of any number of n layers is denoted and given generally by:

$$SE_{nlayers}(f) = \sum_1^n R_x(f) + \sum_1^n A_x(f) + \sum_1^n M_x(f) \quad (2)$$

In the illustrative embodiment depicted in FIGS. 1-4, the STS 165 has four layers: the thermal interface material layer 180, the metal layer 170, a thermal interface material layer 185 and the metal shell layer 175, thus n is equal to 4 for Equation (2). Since the effect of adding additional layers is cumulative, the first two layers, namely the thermal interface material layer 180 and the metal layer 170, will be used to provide a simplified illustration of the calculation of shield effectiveness. The shield effectiveness $SE_{180\&170}$ for the combination of the thermal interface material layer 180 and the metal layer 170 is given by:

$$SE_{180\&170}(f) = R_{180}(f) + R_{170}(f) + A_{180}(f) + A_{170}(f) + M_{180}(f) + M_{170}(f) \quad (3)$$

where the subscripts "180" and "170" denote the values for the layers 180 or 170. The behavior the two layers 180 and 170 may be modeled by using an analogous arrangement of two cascaded transmission lines. Under this assumption, the total signal attenuation due to reflection $R_{180}(f) + R_{170}(f)$ is given by:

$$R_{180}(f) + R_{170}(f) = 20\log\left(\frac{1}{2}\left|1 + \frac{\eta_{180}(f)}{\eta_0}\right|\right) + \\ 20\log\left(\frac{1}{2}\left|1 + \frac{\eta_{170}(f)}{\eta_{180}(f)}\right|\right) + 20\log\left(\frac{1}{2}\left|1 + \frac{\eta_0}{\eta_{170}(f)}\right|\right) \quad (4)$$

where the intrinsic wave impedance $\eta_{180}(f)$ of the layer 180 is given by:

$$\eta_{180}(f) = \sqrt{\frac{2\pi f \mu_{180} \mu_0}{2\sigma_{180} \sigma_0}} (1 + j) \quad (5)$$

where $\mu_{180}$ is the permeability in tesla·m/ampere of the layer 180, $\mu_0$ is the permeability constant $4\pi 10^{-7}$ tesla·m/ampere, $\sigma_0$ is the conductivity of air or $3 \times 10^{-15}$ to $8 \times 10^{-15}$ mhos/m, $\sigma_{180}$ is the conductivity in mhos/m of the layer 180 and given by:

$$\delta_{180}(f) = \frac{1}{\sqrt{\pi f \mu_{180} \sigma_{180} \sigma_0}} \text{ and} \quad (6)$$

$$j = \sqrt{-1} \quad (7)$$

In Equation (4), the intrinsic wave impedance $\eta_{170}(f)$ of the layer 170 is given by:

$$\eta_{170}(f) = \sqrt{\frac{2\pi f \mu_{170} \mu_0}{2\sigma_{170}\sigma_0}}(1+j) \quad (8)$$

where $\mu_{170}$ is the permeability in tesla of the layer 170 and $\sigma_{170}$ is the conductivity in mhos/m of the layer 170 and given by:

$$\delta_{170}(f) = \frac{1}{\sqrt{\pi f \mu_{170} \sigma_{170} \sigma_0}} \quad (9)$$

Finally, the intrinsic wave impedance $\eta_0$ of air is given by:

$$\eta_0 = \sqrt{\frac{\mu_0}{\varepsilon_0}} \quad (10)$$

where $\varepsilon_0$ is the permittivity constant $8.854 \times 10^{-12}$ C$^2$N·m$^2$.

Referring again to Equation (4), the total signal attenuation $A_{180}(f) + A_{170}(f)$ due to absorption is given by:

$$A_{180}(f) + A_{170}(f) = 20\log_{10} e^1 \left( \frac{d_{180}}{\delta_{180}(f)} + \frac{d_{170}}{\delta_{170}(f)} \right) \quad (11)$$

where $d_{180}$ and $d_{170}$ are the thicknesses of the layers 180 and 170 and $\sigma_{180}$ and $\sigma_{170}$ are given by Equations (6) and (9).

The calculations for signal attenuation due to multiple reflections under a cascade transmission lines model is more complicated than for either reflection or absorption. Here, the attenuation $M_{180}(f)$ due to multiple reflections in the layer 180 is given by:

$$M_{180}(f) = 20\log \left\| 1 - \left( \frac{\eta_{180}(f) - \eta_0}{\eta_{180}(f) + \eta_0} \right) \cdot \left( \frac{\eta_{180}(f) - \eta_{in170}(f)}{\eta_{180}(f) + \eta_{in170}(f)} \right) e^{-2\left(\frac{1}{\delta_{180}(f)} + j\frac{1}{\delta_{180}(f)}\right)d_{180}} \right\| \quad (12)$$

where the intrinsic wave impedance $\eta_{in170}(f)$ of the layer 170 is given by:

$$\eta_{in170}(f) = \eta_{170}(f) \frac{\eta_0 \cdot \cosh\left[\left(\frac{1}{\delta_{170}(f)} + j \cdot \frac{1}{\delta_{170}(f)}\right)d_{170}\right] + \eta_{170}(f) \cdot \sinh\left[\left(\frac{1}{\delta_{170}(f)} + j \cdot \frac{1}{\delta_{170}(f)}\right)d_{170}\right]}{\eta_2 \cdot \cosh\left[\left(\frac{1}{\delta_{170}(f)} + j \cdot \frac{1}{\delta_{170}(f)}\right)d_{170}\right] + \eta_{170}(f) \cdot \sinh\left[\left(\frac{1}{\delta_{170}(f)} + j \cdot \frac{1}{\delta_{170}(f)}\right)d_{170}\right]} \quad (13)$$

and the attenuation $M_{170}(f)$ due to multiple reflections in the layer 170 is given by:

$$M_{170}(f) = 20\log \left\| 1 - \left( \frac{\eta_{170}(f) - \eta_{180}(f)}{\eta_{170}(f) + \eta_{180}(f)} \right) \cdot \left( \frac{\eta_{170}(f) - \eta_0}{\eta_{170}(f) + \eta_0} \right) e^{-2\left(\frac{1}{\delta_{170}(f)} + j\frac{1}{\delta_{170}(f)}\right)d_{170}} \right\| \quad (14)$$

The calculations of attenuation due to reflection, absorption and multiple reflections for each succeeding layer, such as the layers 185 and 175, may be performed by plugging additional terms for the layers 185 and 175 into Equations (3)-(6), (8)-(9) and (11)-(14) above to yield to total attenuation. It is anticipated that attenuation may be enhanced by deliberately mismatching the intrinsic wave impedance of adjacent layers. For example, the thermal spreader plate 170 and the shell 175 may be constructed of materials and/or thicknesses that yield mismatched intrinsic wave impedances. The same is true of interposed dielectrics, such as the thermal interface material layers 180 and 185. The interfaces between such intrinsic wave impedance mismatched layers can enhance signal attenuation.

Shielding is not the only design consideration envisioned by the disclosed embodiments. In addition to serving as an electromagnetic shield, the STS 165 also functions as a thermal management device, such as a thermal spreader. In this regard, material selection for components of a given STS embodiment can take into account beneficial thermal conductivity to provide desirable thermal management. For example, the spreader plate 170 may be composed of a variety of well-known materials that exhibit good thermal conductivity, such as copper, aluminum, silver, platinum, gold, nickel, laminates or combinations of these or the like. Indeed some exemplary materials for the various components of the shields may be as follows:

TABLE 1

Spreader Plate 170 and Shell 175

| Material | Electrical Conductivity σ (mho/m) at 20° C. | Relative Permeability* μ/μ$_0$ | Thermal Conductivity* W/cm · K |
|---|---|---|---|
| Silver | 6.30 × 10$^7$ | — | 4.29 |
| Copper | 5.96 × 10$^7$ | 1 | 3.9 |
| Gold | 4.10 × 10$^7$ | — | 3.17 |
| Aluminum | 3.5 × 10$^7$ | 1 | 2.37 |
| Tungsten | 1.79 × 10$^7$ | — | 1.74 |
| Zinc | 1.69 × 10$^7$ | — | 1.1 |
| Nickel | 1.43 × 10$^7$ | 100 to 600 | 0.9 |
| Iron | 1.00 × 10$^7$ | 25,000 | 0.802 |
| Platinum | 9.43 × 10$^6$ | 1 | 0.716 |
| Tin | 9.17 × 10$^6$ | — | 0.66 |
| Carbon steel (1020) | 5.56 × 10$^6$ | 100 | 0.52 |
| Lead | 4.55 × 10$^6$ | — | 0.35 |

TABLE 1-continued

Spreader Plate 170 and Shell 175

| Material | Electrical Conductivity σ (mho/m) at 20° C. | Relative Permeability* μ/μ₀ | Thermal Conductivity* W/cm · K |
|---|---|---|---|
| Titanium | $2.38 \times 10^6$ | — | 1.8 |
| Constantan (cupronickel 55-45) | $2.04 \times 10^6$ | — | 0.2 |
| Stainless steel (304) | $1.45 \times 10^6$ | — | 0.15 |
| Indium | $1.25 \times 10^7$ | — | 1.47 |
| Carbon (amorphous) | $1.25$ to $2 \times 10^3$ | — | — |
| Carbon (graphite) | $2$ to $3 \times 10^5$ | — | — |
| //basal plane | $2.5 \times 10^{-6}$ to $5.0 \times 10^{-6}$ | //basal plane | |
| ⊥basal plane | $3.0 \times 10^{-3}$ | ⊥basal plane $3.3 \times 10^2$ | |
| Carbon (diamond) | $1 \times 10^{12}$~$1 \times 10^{13}$ | — | 8 to 35 |

*Note that a dash — indicates that the physical constant in question was not available to the inventors at the time of filing.

TABLE 2

Thermal Interface Materials 180 and 185

| Material | Properties* |
|---|---|
| Greases, or thermal compounds, such as silicone or hydrocarbon oils based with various fillers, with bond line thickness from 50 to 100 μm | thermal conductivity from 0.8 to 7.0 W/mK interface resistance from 1 K · cm²/W to about 0.2 K · cm²/W |
| Phase change materials, such as low temperature thermoplastic adhesives | a melting range of about 45 to 80° C. and thermal resistance in the range 0.3-0.7 K cm²/W |
| Gels | thermal resistance in the range 0.4 to 0.8 K · cm²/W. |
| Thermal adhesives, such as epoxy or silicone base with fillers | thermal resistance in the range of about 1 to 0.15 K · cm²/W |

*note that conductivity σ will be dependent on particular compositions

As discussed above, it is anticipated that attenuation may be enhanced by deliberately mismatching the intrinsic wave impedance of adjacent layers, and this may be accomplished by constructing the spreader plate 170 with a material composition and the shell 175 with a different material composition. Furthermore, it is desirable for the thermal spreader 170 to have a shield effectiveness that is absorption dominant to electromagnetic waves and the shell 175 to have a shield effectiveness that is reflection dominant to electromagnetic waves at a given frequency of electromagnetic emissions. In an exemplary embodiment, the thermal spreader plate 170 may be fabricated from copper and with a thickness of about 0.2-0.5 mm and the shell 175 from 301 stainless steel with a thickness of about 0.050 to 0.15 mm. A thin coating of a solderable material, such as tin in a thickness range of about 20 to 100 μm may be added to the shell 175. These selections will yield mismatched intrinsic wave impedances.

Figure 5:
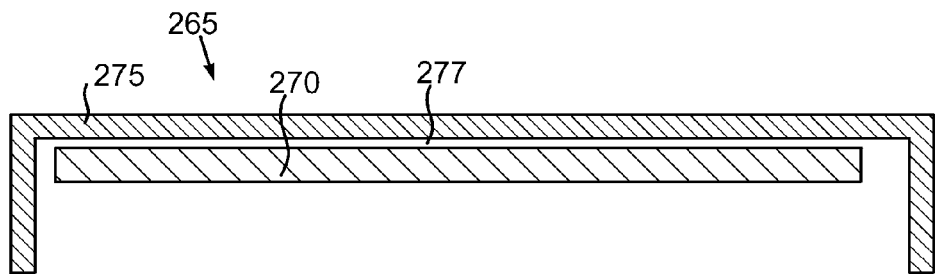
FIG. 5 is a sectional view of an alternate exemplary EMI shield.

The number and types of layers used in the STS 165 and any disclosed alternatives may be varied to provide different types of characteristics. For example, FIG. 5 shows a sectional view of an alternate exemplary STS 265 that includes a spreader plate 270 and a shield shell 275 that may be configured like the spreader plate 170 and shell 175 discussed elsewhere herein. However, in lieu of a material that physically contacts both the plate 270 and the shell 275, a gap 277 is provided between the spreader plate 270 and the shell 275. The gap 277, in this embodiment an air gap, serves as an additional layer to provide signal attenuation by way of reflection and multiple reflections. It may be possible to establish the air gap by first mounting the spreader plate 270 on an underlying structure, such as a chip (not shown) and thereafter placing the shell 275 over but not on the spreader plate 270. Optionally, the spreader plate could be coupled to the shell 275 so as to create the gap 277.

Figure 6:
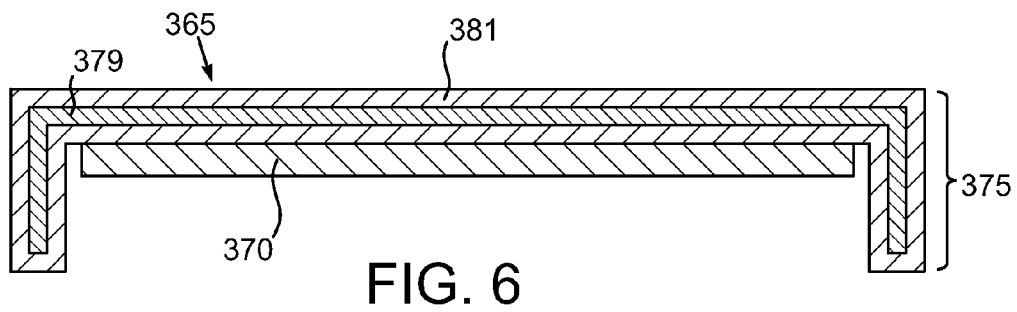
FIG. 6 is a sectional view of another alternate exemplary EMI shield.

Another alternate exemplary STS 365 is depicted in section in FIG. 6. In this illustrative embodiment, the STS 365 may include a spreader plate 370 like the other plate 170 and 270. However, a shell 375 may consist of a metallic core 379 jacketed by a plating layer 381. The layers 370, 379 and 381 may be composed of the types of metallic materials described elsewhere herein. The combination of the plate 370, the core 379 and the plating layer 381 provide a triple layer shield that not only provides thermal management but also multiple interfaces between the layers 370, 379 and 381, which provide the multiple reflection absorption and single reflection signal attenuation as described elsewhere herein.

Figure 7:
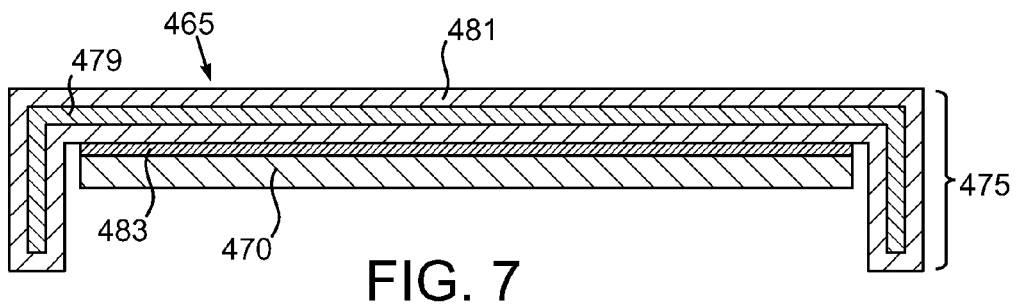
FIG. 7 is a sectional view of another alternate exemplary EMI shield.

Another alternate exemplary embodiment of a STS 465 is depicted in section in FIG. 7. The STS 465 may be substantially identical to the STS 365 depicted in FIG. 6 and thus may include a spreader plate 470, a shell 475 that includes a core 479 and a plating layer 481 jacketing the core 479. Here, however, a dielectric layer 483 may be interposed between the spreader plate 470 and the shell 475. The dielectric layer 483 may be composed of any of the types of dielectric materials described elsewhere herein. The provision of the dielectric layer introduces yet another set of interfaces and a layer that may enhance the signal attenuation of the shield 465.

Figure 8:
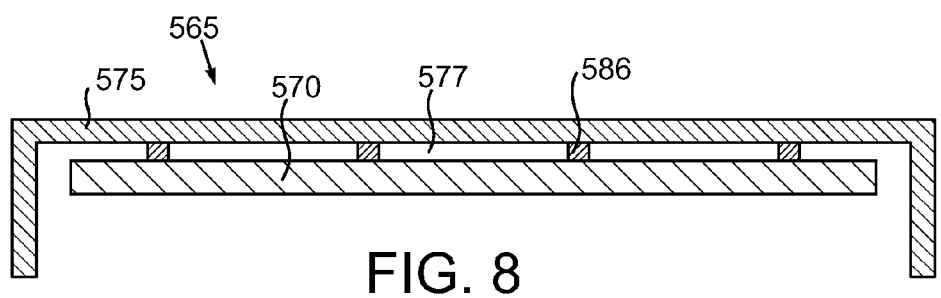
FIG. 8 is a sectional view of another alternate exemplary EMI shield.

Another alternate exemplary embodiment of a STS 565 is depicted in section in FIG. 8. The STS 565 may be substantially similar to the STS embodiment 265 depicted in FIG. 5. Here, however, in lieu of a pure air gap 277 as is the case for the embodiment depicted in FIG. 5, a spreader plate 570 may be separated from a shell 575 by a gap 577, but also connected to the shell 575 by plural posts 586. The posts 586 provide thermal pathways between the spreader plate 570 and the shell 575. In this way, the gap 577 provides less thermal resistance than a pure air gap. The posts 586 may be composed of a variety of thermally conductive materials such as copper, silver, diamond, platinum, gold, laminates of these or the like. The number, size and spacing of the posts 586 may be subject to a great variety. There may be some reduction in the attenuation capacity of the shield 565 due to the posts 586 and the connection that they make between the shell 575 and the plate 570. However, this reduction in attenuation should be weighed against the benefit of providing better capacity for heat transfer from the plate 570 to the shell 575.

Figure 9:
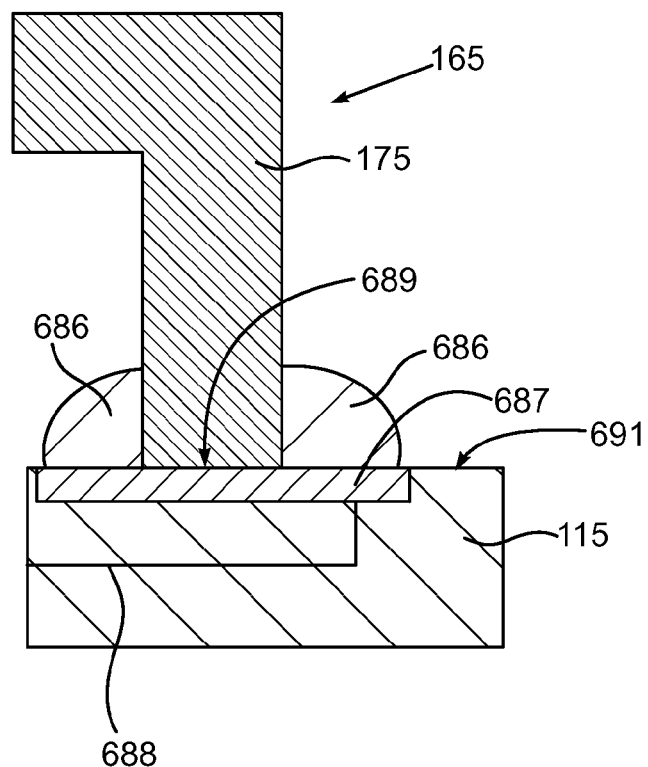
FIG. 9 is a portion of FIG. 2 shown at greater magnification.

A variety of mounting schemes may be used to connect the STS 165, and disclosed alternatives, to the substrate 115. In this regard, attention is now turned to FIG. 9, which is the portion of FIG. 2 circumscribed by the dashed rectangle 195 shown at greater magnification. Note that due to the location of the dashed rectangle 195, a portion of the shield shell 175 of the STS 165, as well as a portion of the substrate 115 are shown. It is desirable to electrically connect the shield shell 175 to a ground pathway associated with the substrate 115. This may be accomplished in a variety of ways. For example, the shield shell 175 may be both physically and electrically connected to the substrate 115 by way of one or more solder beads or fillets 686 that may be spaced around the perimeter of the shield shell 175, on the outside and optionally on the inside as well. The solder fillets 686 may be connected electrically to a bond pad 687 that is tied to a ground pathway 688 associated with the substrate 115. Optionally, the pad 687 may be constructed as a single contiguous trace that goes around the perimeter of the shell 175. In like fashion, the solder fillet 686 may be disposed around some or all of the perimeter of the shell 175. In this illustrative embodiment, the shell 175 and in particular a lower peripheral wall 689 thereof may seat directly on an upper surface 691 of the substrate 115. The ground pathway 688, schematically illustrated, may be by through-hole via, buried via, blind via or other conductor.

Figure 10:
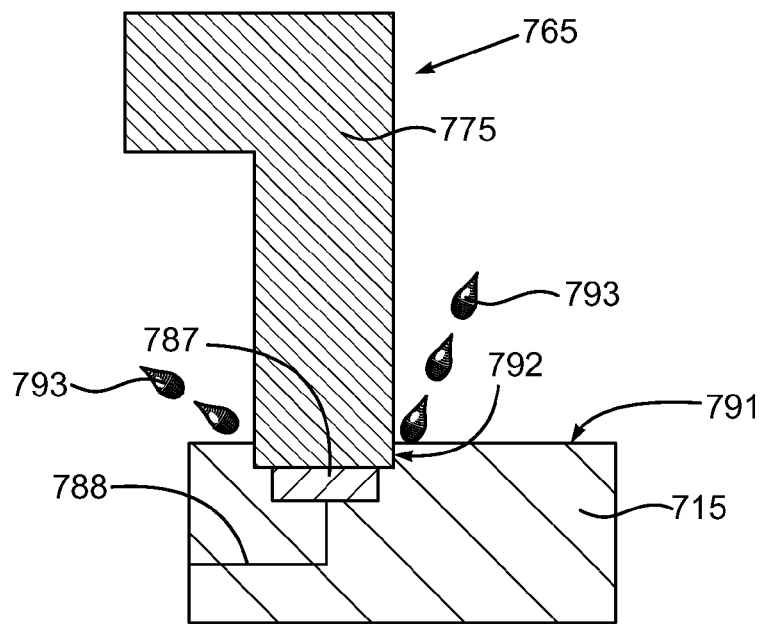
FIG. 10 is a view like FIG. 9, but depicting an alternate exemplary electromagnetic shield coupling process.

Another alternate exemplary embodiment of a substrate 715 and a STS 765 is depicted in section in FIG. 10. Like the embodiment depicted in FIG. 9, the STS 765 may include a shield shell 775 that is mounted on the substrate 715 and connected to a bond pad 787 and ground pathway 788. The ground pathway 788, schematically illustrated, may be by through-hole via, buried via, blind via or other conductor. Instead of being seated on the upper surface 791 of the substrate 715, the shell 775 is depressed into a groove 792 formed in the upper surface 791 of the substrate 715 and placed in direct ohmic contact with the bond pad 787. If desired, an adhesive 793 may be placed at the interface of the upper surface 791 and the shell 775 (inside and outside if desired) to hold the shell 775 in place.

Figure 11:
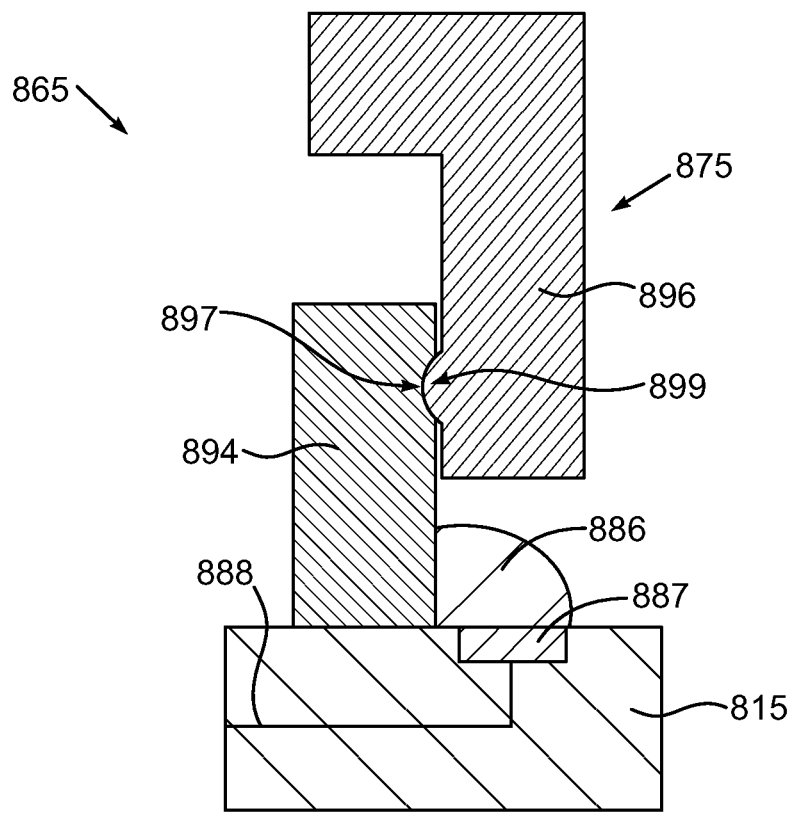
FIG. 11 is a view like FIG. 10, but depicting another alternate exemplary shield coupling process.

Another alternate exemplary embodiment of a substrate 815 and a STS 865 is depicted in section in FIG. 11. Like the embodiment depicted in FIG. 9, the STS 865 may include a shield shell 875 that is mounted on the substrate 815 and connected by a solder fillet 886 to a bond pad 887 and ground pathway 888. Instead in this illustrative embodiment, the shield shell 875 may be configured as a multi-piece structure that includes a bottom shell 894 that may be mounted on the substrate 815 and a top shell 896 that is designed to be placed over the bottom shell 894 and held in place. The top shell 896 may be held in place relative to the bottom shell 894 in a variety of ways. For example, the top shell 896 may be provided with plural bumps 897 that may depress into corresponding dimples 899 in the lower shell 894. Other types of fastening mechanisms include screws, flexible brads, or virtually any other fastening technique.

Figure 12:
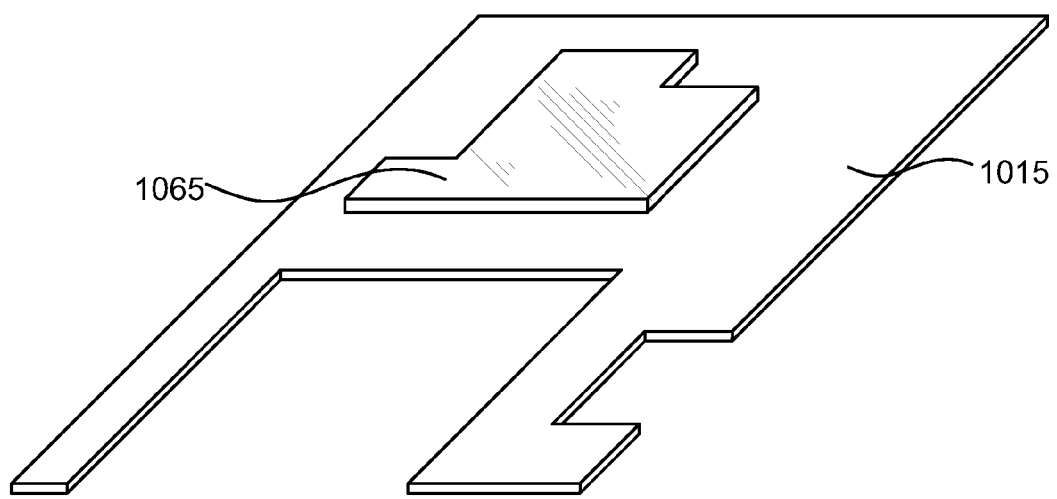
FIG. 12 is a pictorial view of an alternate exemplary circuit board and EMI shield configuration.
Figure 13:
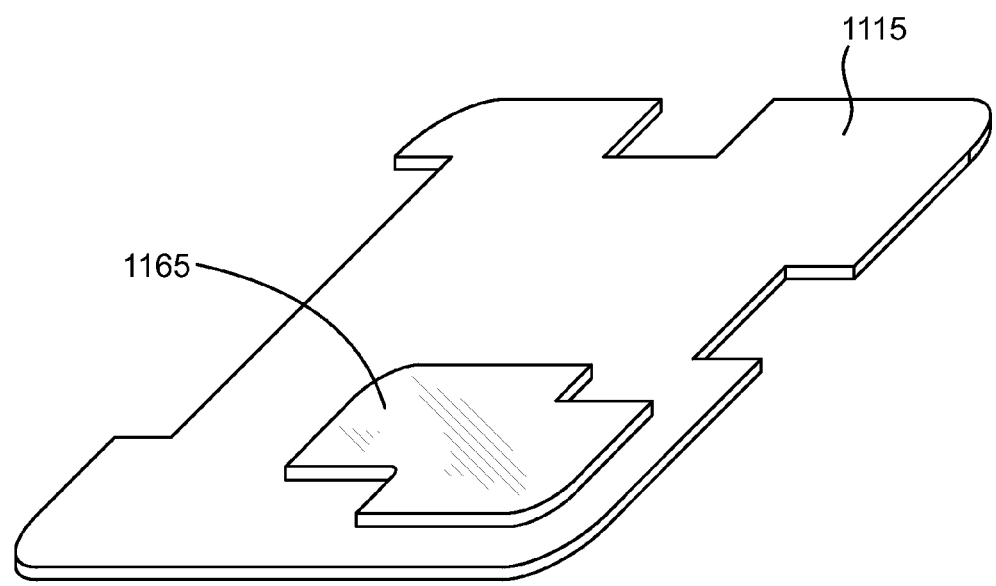
FIG. 13 is a pictorial view of an alternate exemplary circuit board and EMI shield configuration.

As noted above, the footprints of the shields and substrates may be other than rectangular. In this regard, attention is now turned to FIG. 12, which is a pictorial view of an alternate exemplary substrate 1015 and a STS 1065 with other than rectangular footprints. Similarly, FIG. 13 is a pictorial view of another alternate exemplary embodiment in which a substrate 1115 and a STS 1165 may have other than rectangular footprints.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An EMI shield, comprising:
a thermal spreader plate adapted to be seated on and convey heat from an electromagnetic emissions generating component, the thermal spreader plate having a first material composition and a shield effectiveness that is absorption dominant to electromagnetic waves at a given electromagnetic emissions frequency;
a shell to cover and reflect electromagnetic emissions from the electromagnetic emissions generating component, the shell having a second material composition different than the first material composition and a shield effectiveness that is reflection dominant to electromagnetic waves at the given electromagnetic emissions frequency; and
a gap between the thermal spreader plate and the shell and plural posts positioned between the thermal spreader plate and the shell to transfer heat.

2. The EMI shield of claim 1, comprising a thermal interface material between the thermal spreader plate and the electromagnetic emissions generating component.

3. The EMI shield of claim 1, wherein the shell has a rectangular footprint.

4. The EMI shield of claim 1, wherein the shell has a non-rectangular footprint.

5. An apparatus, comprising:
a substrate;
an electromagnetic emissions generating component on the substrate; and
an electromagnetic emissions shield coupled to the substrate and having a thermal spreader plate seated on the electromagnetic emissions generating component, the thermal spreader plate having a first material composition and a shield effectiveness that is absorption dominant to electromagnetic waves at a given electromagnetic emissions frequency, a shell to cover and reflect electromagnetic emissions from the electromagnetic emissions generating component, the shell having a second material composition different than the first material composition and a shield effectiveness that is reflection dominant to electromagnetic waves at the given electromagnetic emissions frequency, and a gap between the thermal spreader plate and the shell and plural posts positioned between the thermal spreader plate and the shell to transfer heat.

6. The apparatus of claim 5, comprising a thermal interface material between the thermal spreader plate and the electromagnetic emissions generating component.

7. The apparatus of claim 5, comprising an electronic device, the substrate being mounted in the electronic device.

8. The apparatus of claim 5, wherein the shell comprises a peripheral wall that projects toward the substrate.

9. The apparatus of claim 8, wherein the substrate includes a ground pathway and the peripheral wall is connected to the ground pathway.

10. The apparatus of claim 8, wherein the peripheral wall is partially embedded in the substrate.

11. The apparatus of claim 8, wherein the peripheral wall and the substrate enclose the electromagnetic emissions generating component.

12. The apparatus of claim 5, wherein the shell comprises a bottom shell mounted on the substrate and a top shell placed over and engaged with the bottom shell.

13. The apparatus of claim 12, wherein the substrate includes a ground pathway and the bottom shell is connected to the ground pathway.

14. A method of thermally managing and electromagnetically shielding an electromagnetic emissions generating component, comprising:
seating a thermal spreader plate on the electromagnetic emissions generating component, the thermal spreader plate having a first material composition and a shield effectiveness that is absorption dominant to electromagnetic waves at a given electromagnetic emissions frequency;
covering the thermal spreader plate and the electromagnetic emissions generating component with a shell to with and reflect electromagnetic emissions from the electromagnetic emissions generating component, the shell having a second material composition different than the first material composition and a shield effectiveness that is reflection dominant to electromagnetic waves at the given electromagnetic emissions frequency;

establishing a gap between the thermal spreader plate and the shell; and positioning plural posts positioned between the thermal spreader plate and the shell to transfer heat.

15. The method of claim 14, comprising placing a thermal interface material between the thermal spreader plate and the electromagnetic emissions generating component.

16. The method of claim 14, wherein the electromagnetic emissions generating component is positioned on a substrate and the substrate is positioned in an electronic device.

17. A method of manufacturing, comprising:

fabricating a thermal spreader plate adapted to be seated on and convey heat from an electromagnetic emissions generating component, the thermal spreader plate having first material composition and a shield effectiveness that is absorption dominant to electromagnetic waves at a given electromagnetic emissions frequency;

fabricating a shell to cover and reflect electromagnetic emissions from the electromagnetic emissions generating component, the shell having a second material composition different than the first material composition and a shield effectiveness that is reflection dominant to electromagnetic waves at the given electromagnetic emissions frequency;

placing the thermal spreader plate on the electromagnetic emissions generating component and the shell over the thermal spreader plate and the electromagnetic emissions generating component;

establishing a gap between the thermal spreader plate and the shell; and positioning plural posts positioned between the thermal spreader plate and the shell to transfer heat.

18. The method of claim 17, comprising placing a thermal interface material between the thermal spreader plate and the electromagnetic emissions generating component.

\* \* \* \* \*